(12) United States Patent
Susumu

(10) Patent No.: US 9,258,936 B2
(45) Date of Patent: Feb. 9, 2016

(54) ADSORPTION HEAD FOR SURFACE MOUNTING DEVICE

(71) Applicant: HANWHA TECHWIN CO., LTD., Changwon-si (KR)

(72) Inventor: Kitada Susumu, Changwon (KR)

(73) Assignee: Hanwha Techwin Co., Ltd., Changwon-si (KR)

( * ) Notice: Subject to any disclaimer, the term of this patent is extended or adjusted under 35 U.S.C. 154(b) by 387 days.

(21) Appl. No.: 13/711,009

(22) Filed: Dec. 11, 2012

(65) Prior Publication Data

US 2013/0160293 A1 Jun. 27, 2013

(30) Foreign Application Priority Data

Dec. 27, 2011 (JP) .................................. 2011-285816
Mar. 21, 2012 (KR) ........................ 10-2012-0028958

(51) Int. Cl.
*H05K 13/04* (2006.01)
*B23P 6/00* (2006.01)
*B23P 11/00* (2006.01)

(52) U.S. Cl.
CPC .............. *H05K 13/0408* (2013.01); *B23P 6/00* (2013.01); *B23P 11/00* (2013.01); *H05K 13/046* (2013.01); *Y10T 29/494* (2015.01); *Y10T 29/4973* (2015.01); *Y10T 29/49723* (2015.01); *Y10T 29/53191* (2015.01)

(58) Field of Classification Search
CPC .... B25J 15/04; B25J 15/0408; B25J 15/0616; B25J 15/0658; H05K 13/0408; H05K 13/046; Y10T 29/53191; Y10T 29/494; Y10T 29/49723; Y10T 29/4973; B23P 6/00; B23P 11/00

USPC ........... 294/183; 414/752.1; 901/40; 403/349
See application file for complete search history.

(56) References Cited

U.S. PATENT DOCUMENTS

| 4,703,965 | A | * | 11/1987 | Lee et al. | ................... 414/752.1 |
|---|---|---|---|---|---|
| 4,753,004 | A | * | 6/1988 | Fujioka | .......................... 29/740 |
| 5,807,221 | A | | 9/1998 | Yi | |
| 6,161,886 | A | * | 12/2000 | Furuya et al. | ................. 294/183 |
| 6,684,490 | B2 | | 2/2004 | Chun et al. | |
| 7,000,966 | B2 | * | 2/2006 | Kramarczyk et al. | ....... 294/86.4 |
| 7,426,781 | B2 | * | 9/2008 | Burger | ............................ 29/740 |
| 7,712,712 | B2 | * | 5/2010 | Richter | ......................... 248/161 |
| 2002/0185875 | A1 | * | 12/2002 | Kim | ............................. 294/64.1 |

FOREIGN PATENT DOCUMENTS

| JP | 11330792 A | 11/1999 |
|---|---|---|
| JP | 2005-032860 A | 2/2005 |
| JP | 2005-327774 A | 11/2005 |

(Continued)

OTHER PUBLICATIONS

Communication dated Aug. 25, 2015, issued by the Japanese Patent Office in counterpart Japanese Application No. 2011-285816.

*Primary Examiner* — Dean Kramer
(74) *Attorney, Agent, or Firm* — Sughrue Mion, PLLC

(57) ABSTRACT

An adsorption head for a surface mounting device, including: a main body; a shaft which moves in a direction of a longitudinal axis of the shaft and rotates around the longitudinal axis mounted on the main body, and the shaft includes a lower shaft and an upper shaft. The lower shaft is detachably attached to the upper shaft; and an adsorption nozzle which adsorbs electronic parts mounted on a lower end of the shaft, wherein an air passage connected to the adsorption nozzle is provided in the lower shaft.

9 Claims, 4 Drawing Sheets

(56) References Cited

FOREIGN PATENT DOCUMENTS

| | | | |
|---|---|---|---|
| JP | 2008-103453 A | 5/2008 | |
| JP | 2010-098022 A | 4/2010 | |
| KR | 0161834 B1 | 12/1998 | |
| KR | 20010106003 A | 11/2001 | |

* cited by examiner

ADSORPTION HEAD FOR SURFACE MOUNTING DEVICE

CROSS-REFERENCE TO RELATED PATENT APPLICATION

This application claims priority from Korean Patent Application No. 10-2012-0028958, filed on Mar. 21, 2012, in the Korean Intellectual Property Office, and priority from Japanese Patent Application No. 2011-285816, filed on Dec. 27, 2011, in the Japanese Patent Office, the disclosures of which are incorporated herein by reference in their entireties.

BACKGROUND

1. Field

Apparatuses and methods consistent with exemplary embodiments relate to an adsorption head for a surface mounting device.

2. Description of the Related Art

A surface mounting device includes a structure whereby an adsorption head having an adsorption nozzle adsorbs electronic parts placed in a part supplier, transports the electronic parts to a printed substrate, and mounts the electronic parts in a predetermined location on the printed substrate.

Also, typically, a shaft is mounted on the main body of the adsorption head main body and an adsorption nozzle for adsorbing electronic parts is mounted on a lower end of the shaft (for example, JP Pub. No. 11-330792A). The shaft is movable vertically and rotatable around an axis thereof. Also, an air passage extending through the adsorption nozzle is formed inside the shaft, and when the adsorption nozzle adsorbs a part, a negative pressure is applied to the part through the air passage, and when a part is mounted, a fine positive pressure is applied to the part.

Additionally, since dust may highly likely accumulate in the air passage in the shaft, cleaning needs to be performed regularly or frequently. Also, since a lower portion of the shaft is installed with high precision to slide with respect to the main body of the adsorption head main body so as to secure an accurate vertical movement and rotation of the shaft, when wear occurs due to use and the degree of wear exceeds a reference level, the shaft needs to be replaced. Also, the lower portion of the shaft may be deformed by an external force due to collisions with parts on a printed substrate, and in this case, the shaft also needs to be replaced.

When a maintenance work, such as cleaning of the air passage in the shaft and replacing of the shaft, is conducted, the shaft needs to be separated from the adsorption head main body. The air passage is formed in the lower portion of the shaft, and the lower portion of the shaft may be deformed. An entire shaft in the related art is separated from the adsorption head main body because upper and lower portions of the shaft are integrally formed with each other. In most cases, components, such as a spline nut, are installed on the shaft, and separating the shaft from the main body of the adsorption head main body requires many and time-consuming processes.

SUMMARY

One or more exemplary embodiments provide an adsorption head for a surface mounting device, the adsorption head having improved maintenance characteristics.

According to an aspect of an exemplary embodiment, there is provided an adsorption head for a surface mounting device, including: a main body; a shaft which moves in a direction of a longitudinal axis of the shaft and rotates around the longitudinal axis mounted on the main body, and the shaft includes a lower shaft and an upper shaft. The lower shaft is detachably attached to the upper shaft; and an adsorption nozzle which adsorbs electronic parts mounted on a lower end of the shaft, wherein an air passage connected to the adsorption nozzle is provided in the lower shaft.

If the lower shaft is detached from the upper shaft, the lower shaft is detached from the main body.

The lower shaft may include joint pins disposed at an upper end of the lower shaft, and the upper shaft may include joint holes disposed at a lower end of the upper shaft, and the lower shaft is detachably attached to the upper shaft if the joint pins are inserted through the joint holes.

The joint pins may be inserted through the joint holes via a motion along a longitudinal axis direction of the shaft and a motion around the axis.

According to another aspect of an exemplary embodiment, there is provided a method of assembling an adsorption head for a surface mounting device, the method including: providing a lower shaft and an upper shaft; attaching the lower shaft to the upper shaft to form a shaft; mounting the shaft on a main body of the adsorption head; and mounting an adsorption nozzle on a lower end of the shaft.

The lower shaft may include joint pins disposed at an upper end of the lower shaft and the upper shaft may include joint holes disposed at a lower end of the upper shaft.

An air passage connected to the adsorption nozzle may be provided in the lower shaft.

The attaching of the lower shaft to the upper shaft may include: inserting the lower shaft into the upper shaft; pushing the lower shaft towards the upper shaft in a direction of a longitudinal axis of a shaft; and rotating the lower shaft around the longitudinal axis of the shaft.

The pushing of the lower shaft towards the upper shaft may include pushing the lower shaft towards the upper shaft in a direction of a longitudinal axis of a shaft until the joint pins are inserted into a stylobate of the joint holes.

The attaching of the lower shaft to the upper shaft may further include pulling the lower shaft away from the upper shaft while the rotating of the lower shaft around the longitudinal axis of the shaft.

According to yet another aspect of an exemplary embodiment, there is provided a method of performing a maintenance on an adsorption head for a surface mounting device, the method including: providing a shaft comprising a lower shaft and an upper shaft, wherein the shaft is mounted on a main body of the adsorption head and an adsorption nozzle is provided inside the lower shaft; removing the lower shaft from the upper shaft thereby removing the lower shaft from the main body; and replacing the lower shaft or cleaning an air passage connected to the adsorption nozzle.

The lower shaft may include joint pins disposed at an upper end of the lower shaft and the upper shaft may include joint holes disposed at a lower end of the upper shaft.

The removing of the lower shaft from the upper shaft may include pushing the lower shaft towards the upper shaft in a direction of a longitudinal axis of a shaft; and rotating the lower shaft around the longitudinal axis of the shaft.

The removing of the lower shaft from the upper shaft may further include pushing the lower shaft while rotating of the lower shaft such that the joint pins disposed at the upper end of the lower shaft separated from the joint holes disposed at the lower end of the upper shaft.

BRIEF DESCRIPTION OF THE DRAWINGS

The above and other aspects of the disclosure will become more apparent and more readily appreciated from the following descriptions of exemplary embodiments, taken in conjunction with the attached drawings of which.

DETAILED DESCRIPTION

Hereinafter, exemplary embodiments will be described in detail with reference to the accompanying drawings to enable a person having ordinary knowledge in the technical field to easily implement the exemplary embodiments However, the inventive concept is not limited to the embodiments, and the embodiments herein are rather introduced to provide easy and complete understanding of the scope and spirit of the present invention. Also, the terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated elements, steps, operations, and/or devices, but do not preclude the presence or addition of one or more other features, integers, steps, operations, elements, components, and/or groups thereof. It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

Figure 1:
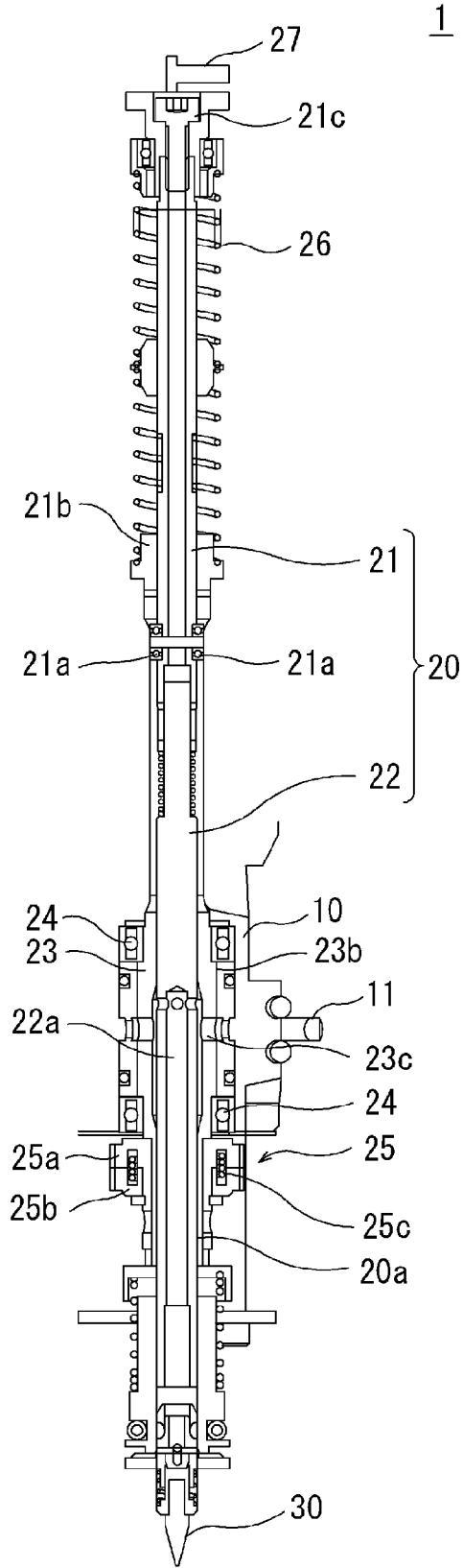
FIG. 1 is a cross-sectional view of an adsorption head for a surface mounting device, according to an exemplary embodiment.

FIG. 1 is a cross-sectional view of an adsorption head 1 for a surface mounting device according to an exemplary embodiment.

Referring to FIG. 1, in the adsorption head 1 for the surface mounting device according to the exemplary embodiment, a shaft 20 includes an upper shaft 21 and a lower shaft 22 and is mounted on a main body 10 of the adsorption head 1. The shaft 20 is moveable along a longitudinal axis of the shaft and rotatable around the same axis. Also, an adsorption nozzle 30, which adsorbs electronic parts, is mounted at a lower end of the lower shaft 22.

An air passage 22a is formed in the lower shaft 22. The air passage 22a has an end passing an inlet/outlet hole 11 that is formed in the main body 10 through an air supply hole 23c formed in a shaft housing 23, and the other end connected to the adsorption nozzle 30. Also, an inlet/outlet gas system (not shown), which is automatically controlled, may be connected to the inlet/outlet hole 11. Accordingly, when the adsorption nozzle 30 adsorbs a part, a negative pressure is applied to the adsorption nozzle 30 from the inlet/outlet hole 11 through the air supply hole 23c and the air passage 22a, and when a part is mounted, a fine positive pressure is applied to the adsorption nozzle 30.

Figure 2:
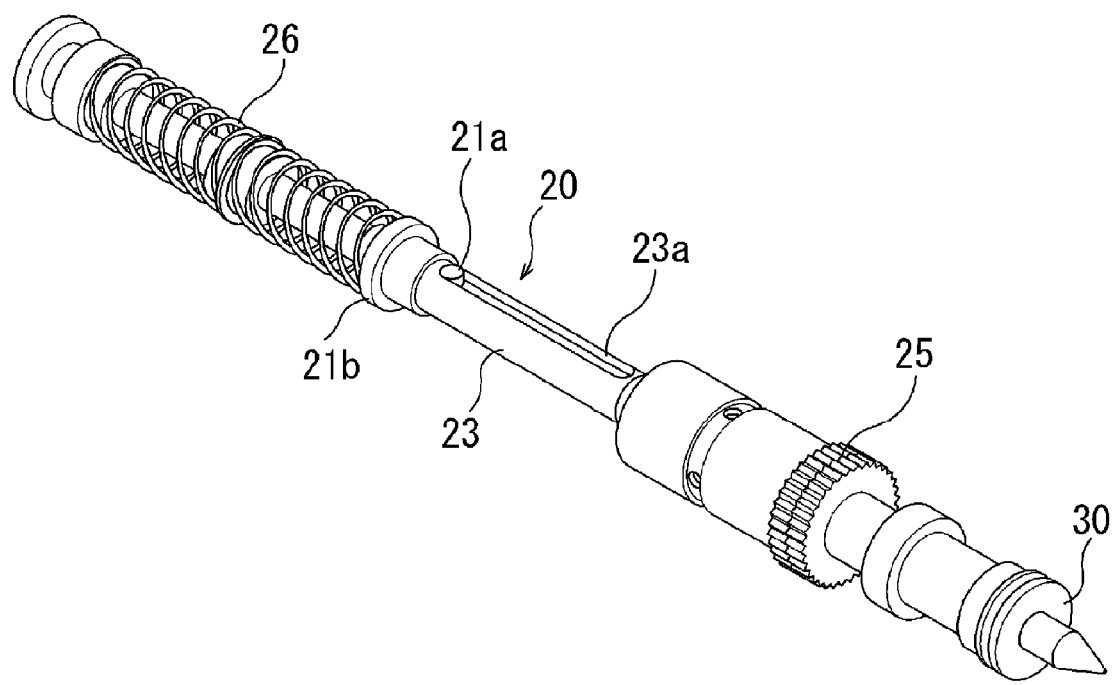
FIG. 2 is a perspective view of a shaft of the adsorption head for the surface mounting device of FIG. 1.
Figure 3:
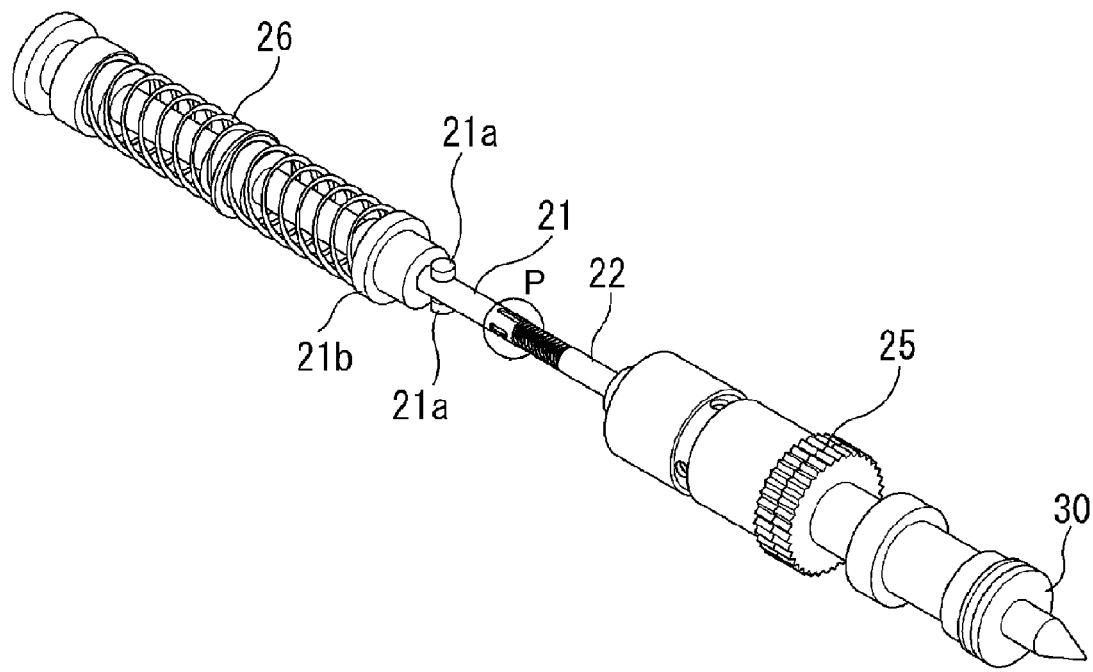
FIG. 3 is a perspective view of an inner structure of the shaft of FIG. 2.
Figure 4:
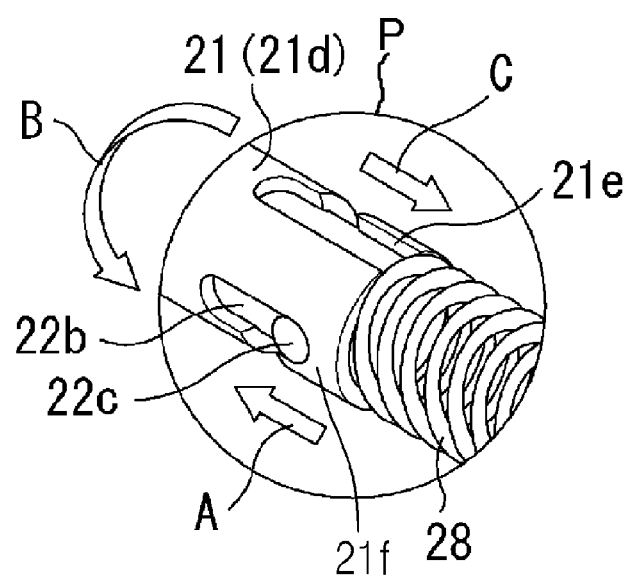
FIG. 4 is an enlarged view of a portion P of FIG. 3.
Figure 5:
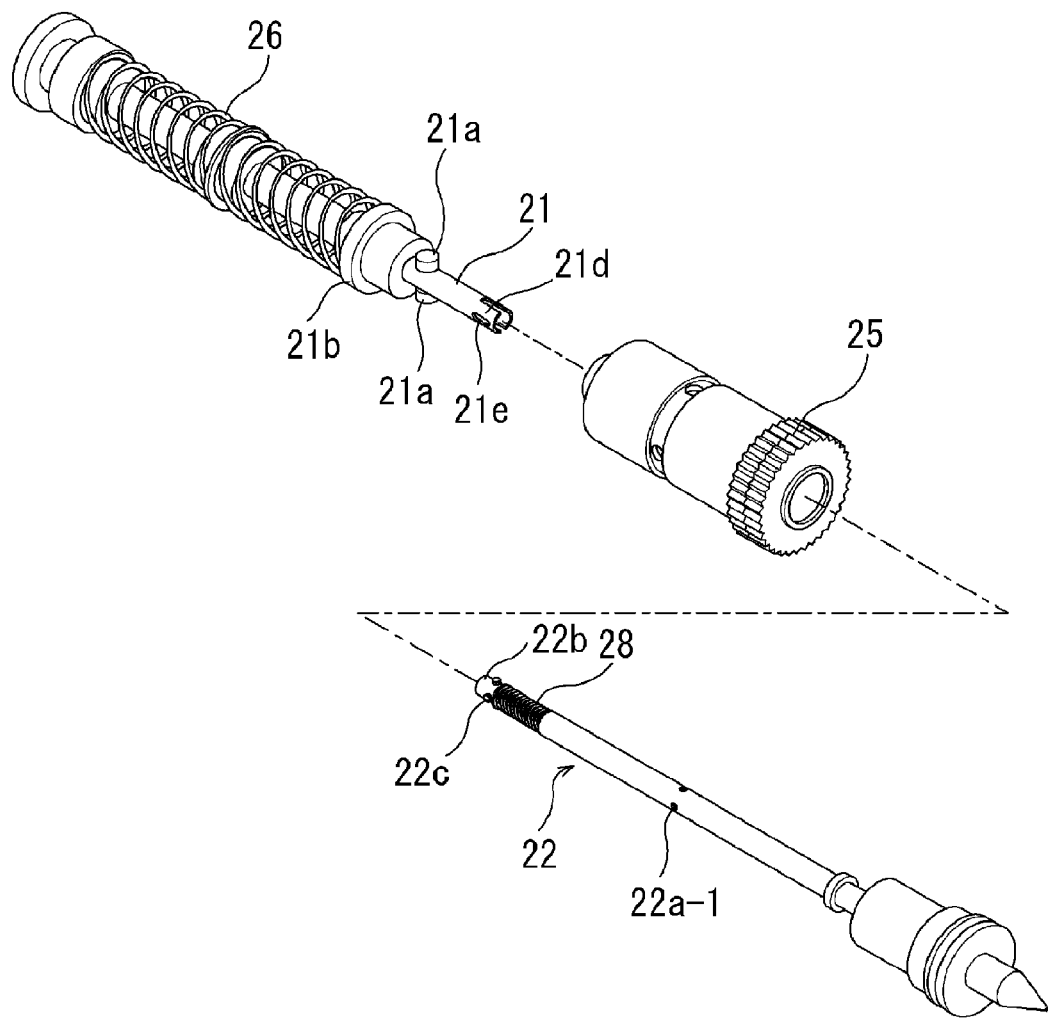
FIG. 5 is a perspective view of the shaft of FIG. 3 when an upper shaft is separated from a lower shaft.

FIG. 2 is a perspective view of a shaft 20 of the adsorption head 1 for the surface mounting device of FIG. 1, FIG. 3 is a perspective view of the shaft 20 of FIG. 2, FIG. 4 is an enlarged view of a portion P of FIG. 3, and FIG. 5 is a perspective view of the shaft 20 of FIG. 3 when the upper shaft 21 is separated from the lower shaft 22.

Hereinafter, the structure of the shaft 20 is described below with reference to FIGS. 1 to 5.

The shaft 20 includes the upper shaft 21 and the lower shaft 22 and is installed through the shaft housing 23. In detail, a pair of bearings 21a are fixed on the upper shaft 21, and the bearings 21a are inserted through a guide hole 23a of the shaft housing 23. Accordingly, the shaft 20 may be slidable along a longitudinal direction of the shaft with respect to the shaft housing 23 within the guide hole 23a and may also rotate together with the housing 23 with respect to the sliding direction.

Two bearings 24 are installed on the shaft housing 23. Thus, the shaft housing 23 is not movable in the longitudinal direction of the shaft with respect to the main body 10 and is rotatable around a longitudinal axis of the shaft 20. Also, a gear 25 is installed on the shaft housing 23 to rotate the shaft housing 23 around the longitudinal axis of the shaft 20. The gear 25 may be a backlashless gear using a torsion spring. The gear 25 includes a fixed gear 25a fixed on the lower shaft 22 of the shaft 20, a shaking gear 25b contacting the fixed gear 25a, and a torsion spring 25c interposed between the fixed gear 25a and the shaking gear 25b. When the gear 25 is driven by a driving gear connected to a driving motor (not shown), the shaft housing 23 rotates together with the shaft 20 around the longitudinal axis of the shaft 20.

Also, the shaft housing 23 has the air supply hole 23c for supplying air to the air passage 22a of the lower shaft 22. The air supply hole 23c is connected with the inlet/outlet hole 11 of the main body 10, and the air supplied via the air supply hole 23c is supplied to the air passage 22a through an inlet 22a-1 (shown in FIG. 5) of the air passage 22a.

Also, a rotation sliding surface 23b of the shaft housing 23 that contacts the main body 10 when the shaft housing 23 rotates around the longitudinal axis of the shaft 20 is mechanically sealed. Also, a sliding surface 20a of the shaft 20 that contacts the shaft housing 23 when the shaft 20 ascends or descends is mechanically sealed.

An upper coil spring 26 covers the circumference of an upper portion of the upper shaft 21 of the shaft 20. The upper coil spring 26 is supported by a spring base 21b installed on the circumference of the upper shaft 21, and when the shaft 20 illustrated in FIG. 2 is mounted on the main body 10 as illustrated in FIG. 1, the coil spring 26 applies a force for moving the shaft 20 upward, i.e. in a direction toward the upper shaft 21 along the longitudinal direction of the shaft. Accordingly, the shaft 20 is always elastically biased toward the upward location. When the shaft 20 descends, i.e. in a direction toward the lower shaft 22 along the longitudinal direction of the shaft, a pressing member 27 located above a shaft head 21c fixed on an upper end of the upper shaft 21 is pressed. In this case, the shaft 20 descends while an elastic force of the coil spring 26 opposes this motion.

A connection structure of the upper shaft 21 and the lower shaft 22 is described below. According to the exemplary embodiment, the lower shaft 22 is installed to be detachable from the upper shaft 21. In detail, according to the exemplary embodiment, as clearly illustrated in FIG. 5, an insertion portion 22b having a circular cross-sectional area is formed on an upper end of the lower shaft 22, and two joint pins 22c protrude from a circumferential surface of the insertion portion 22b. The joint pins 22c are spaced from each other at an angle of 180°. Also, a receiving portion 21d into which the insertion portion 22b is inserted and which has a corresponding circular cross-sectional area is formed on a lower portion of the upper shaft 21, and the receiving portion 21d has joint holes 21e through which the join pins 22c are inserted. A stylobate 21f of the joint holes 21e is open to allow the joint pins 22c to be inserted therethrough.

As illustrated in FIG. 4, the insertion portion 22b of the lower shaft 22 is inserted into the receiving portion 21d of the upper shaft 21. The lower shaft 22 is pushed further in an A direction toward the upper portion 21 until the joint pins 22c are located inside the stylobate 21f of the joint holes 21e, and then, the lower shaft 22 is pulled away from the upper portion in a C direction while rotating in a B direction. Thus, the joint pins 22c are firmly inserted through the joint holes 21e, and thus, the lower shaft 22 is attached to the upper shaft 21. Also, the lower shaft 22 may be detached from the upper shaft 21 in the reverse installation sequence.

In the exemplary embodiment, a lower coil spring 28 is located on a lower side of the insertion portion 22b of the lower shaft 22. The lower coil spring 28 may apply a force for pulling the lower shaft 22 downward with respect to the upper shaft 21 when the lower shaft 22 is connected with the upper shaft 21 in the sequence described above. Due to the operation of the lower coil spring 28, when the lower shaft 22 is connected to the upper shaft 21, as illustrated in FIG. 4, the joint pins 22c are elastically biased in an area where the joint pins 22c contact walls of the join holes 21e. Accordingly, the axial (or lengthwise) location of the lower shaft 22 with respect to the upper shaft 21 is fixed, and the entire length of the shaft 20 remains constant.

Also, according to the exemplary embodiment, as described above, the lower shaft 22 is connected to or separated from the upper shaft 21 only by motions of the shaft 20 in the A direction and the C direction, which are the longitudinal axis direction of the shaft 20, and the B direction, which is a direction around the longitudinal axis. Accordingly, when the shaft structure illustrated in FIG. 2 is installed on the main body 10 as illustrated in FIG. 1, the lower shaft 22 is easily separated from the upper shaft 21, and the lower shaft 22 separated from the upper shaft 21 may be easily separated from the main body 10. Thus, a maintenance work on and replacing of the lower shaft 22 may be easily performed.

According to the exemplary embodiment, a shaft 20 consists of a lower shaft 22 including an entire air passage 22a and an upper shaft 21 located above the lower shaft. Due the separate structure of the shaft, only the lower shaft 22 is needed to be separated to clean the air passage, thereby increasing maintenance work efficiency.

Also, since the lower shaft 22 is easily subjected to wear and deformation, when wear or deformation occurs, only the lower shaft 22 is needed to be replaced, thereby increasing maintenance work efficiency.

While exemplary embodiments have been particularly shown and described above, it will be understood by those of ordinary skill in the art that various changes may be made therein without departing from the spirit and principles of the present inventive concept as defined by the following claims.

What is claimed is:

1. An adsorption head for a surface mounting device, comprising:
    a main body;
    a housing provided in the main body;
    a shaft configured to move in a direction of a longitudinal axis of the shaft through the housing, the shaft comprising an upper shaft and a lower shaft detachably attached to the upper shaft, the upper and the lower shafts configured to move through the housing; and
    an adsorption nozzle configured to adsorb electronic parts mounted on a lower end of the shaft,
    wherein an air passage connected to the adsorption nozzle is provided in the lower shaft, and
    wherein the housing and the shaft are configured to rotate together about the longitudinal axis of the shaft.

2. The adsorption head of claim 1, wherein in response to the lower shaft being detached from the upper shaft, the lower shaft is detached from the main body.

3. The adsorption head of claim 2, wherein the lower shaft comprises joint pins disposed at an upper end of the lower shaft,
    wherein the upper shaft comprises joint holes disposed at a lower end of the upper shaft, and
    wherein the lower shaft is detachably attached to the upper shaft in response to the joint pins being inserted through the joint holes.

4. The adsorption head of claim 3, wherein a motion for inserting the joint pins through the joint holes is a motion along a longitudinal axis of the shaft and a motion around the axis.

5. The adsorption head of claim 1, wherein the lower shaft comprises joint pins disposed at an upper end of the lower shaft,
    wherein the upper shaft comprises joint holes disposed at a lower end of the upper shaft, and
    wherein the lower shaft is detachably attached to the upper shaft in response to the joint pins being inserted through the joint holes.

6. The adsorption head of claim 5, wherein a motion for inserting the joint pins through the joint holes is a motion along a longitudinal axis of the shaft and a motion around the axis.

7. The adsorption head of claim 1,
    wherein the housing comprises a guide hole, and the housing comprises a pair of bearings fixedly attached to the shaft, and
    wherein the pair of bearings are inserted through the guide hole of the housing.

8. The adsorption head of claim 7, wherein the guide hole corresponds to a slot extending along the direction of the longitudinal axis of the shaft.

9. The adsorption head of claim 1,
    wherein the adsorption head further comprises a gear provided on the housing to rotate the housing around the longitudinal axis of the shaft, and
    wherein the gear comprises:
        a fixed gear attached to the lower shaft;
        a shaking gear contacting the fixed gear; and
        a torsion spring interposed between the fixed gear and the shaking gear.

* * * * *